(12) United States Patent
Ushijima et al.

(10) Patent No.: US 7,436,672 B2
(45) Date of Patent: Oct. 14, 2008

(54) SEMICONDUCTOR DEVICE AND METHOD OF MANUFACTURE THEREOF

(75) Inventors: Koichi Ushijima, Hyogo (JP); Hussein Khalid Hassan, Tokyo (JP); Noboru Miyamoto, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 67 days.

(21) Appl. No.: 11/109,788

(22) Filed: Apr. 20, 2005

(65) Prior Publication Data

US 2006/0067059 A1 Mar. 30, 2006

(30) Foreign Application Priority Data

Sep. 28, 2004 (JP) ............... 2004-281144

(51) Int. Cl.
*H05K 7/20* (2006.01)
*H05K 9/00* (2006.01)

(52) U.S. Cl. .................. 361/715; 361/704; 361/800; 361/816; 165/104.33; 165/185

(58) Field of Classification Search ........... 361/600, 361/714–715, 700, 704, 707, 709–710, 719, 361/799–800, 816, 818; 165/80.3, 104.33, 165/185; 257/508
See application file for complete search history.

(56) References Cited

U.S. PATENT DOCUMENTS

| | | | | |
|---|---|---|---|---|
| 5,134,546 A | * | 7/1992 | Izumi et al. ............... 361/736 |
| 5,606,919 A | * | 3/1997 | Fox et al. ................ 108/50.02 |
| 5,793,106 A | * | 8/1998 | Yasukawa et al. ............ 257/712 |
| 6,181,590 B1 | * | 1/2001 | Yamane et al. ............... 363/132 |
| 6,215,679 B1 | * | 4/2001 | Yamane et al. ............... 363/132 |
| 6,501,167 B2 | * | 12/2002 | Hanamura .................. 257/691 |
| 6,509,629 B2 | * | 1/2003 | Yoshimatsu et al. .......... 257/660 |
| 6,646,884 B1 | * | 11/2003 | Frisch et al. ................ 361/728 |
| 6,700,191 B2 | * | 3/2004 | Schmid et al. ............... 257/691 |
| 6,703,699 B2 | * | 3/2004 | Kawaguchi ................. 257/678 |
| 6,762,937 B2 | * | 7/2004 | Kimoto et al. .............. 361/699 |
| 6,822,850 B2 | * | 11/2004 | Pfeifer et al. ................ 361/611 |
| 6,822,865 B2 | * | 11/2004 | Balszunat et al. ........... 361/699 |
| 6,900,986 B2 | * | 5/2005 | Kimoto et al. .............. 361/704 |
| 6,903,457 B2 | * | 6/2005 | Nakajima et al. ............ 257/717 |
| 6,956,742 B2 | * | 10/2005 | Pfeifer et al. ............... 361/709 |
| 7,190,070 B2 | * | 3/2007 | Manz et al. ................. 257/723 |
| 2005/0051874 A1 | * | 3/2005 | Ushijima .................... 257/573 |

FOREIGN PATENT DOCUMENTS

JP 2001-250890 9/2001

* cited by examiner

*Primary Examiner*—Jayprakash N Gandhi
*Assistant Examiner*—Robert J Hoffberg
(74) *Attorney, Agent, or Firm*—Buchanan Ingersoll & Rooney PC

(57) ABSTRACT

A transfer mold type power module ("TPM") is provided with a projection at each of the four corners on its front main surface. The TPM is also provided a first screw hole at its center. A shielding plate is provided with a second crew hole in a position that corresponds to the first screw hole. A control substrate is provided with third screw holes in positions that correspond to the projections. The shielding plate and the TPM are joined by putting a first screw through the first and second screw holes and temporarily fastening the tip of the first screw by a temporary fastening member at the rear main surface of the TPM. The control substrate and the TPM are joined by second screws via the third screw holes.

24 Claims, 11 Drawing Sheets

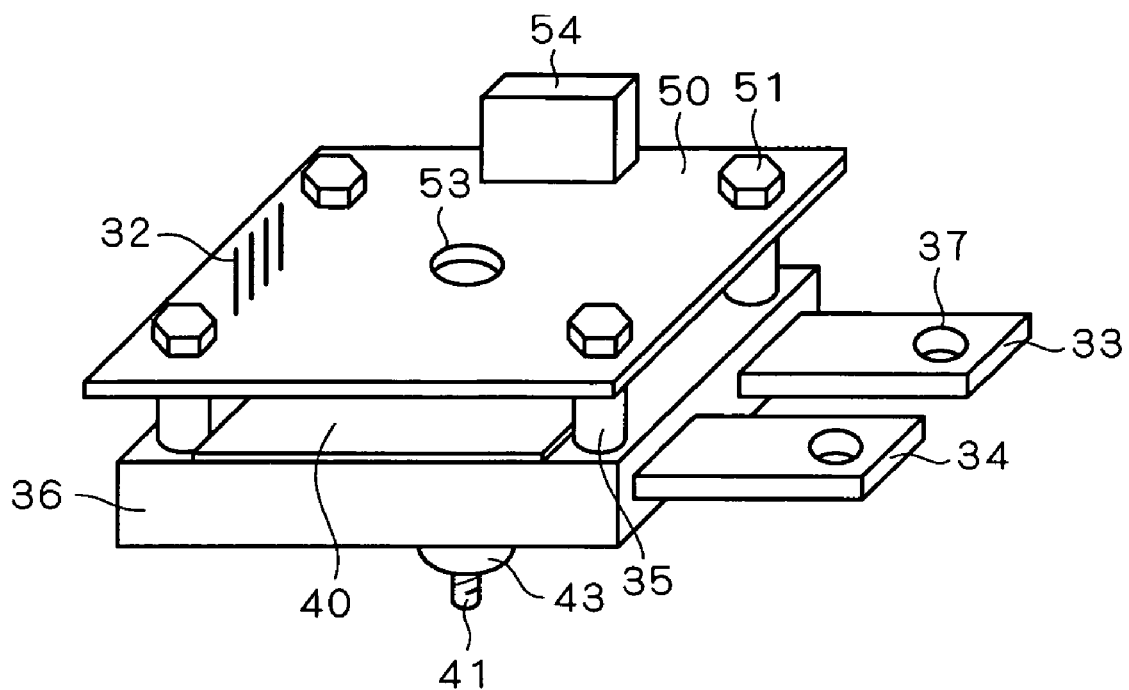
F I G . 1

SEMICONDUCTOR DEVICE AND METHOD OF MANUFACTURE THEREOF

BACKGROUND OF THE INVENTION

1. Field of the Invention

The present invention relates to semiconductor devices and methods of manufacture thereof and, more particularly, to semiconductor devices using a transfer mold type power module and methods of manufacture thereof.

2. Description of the Background Art

Conventionally, a package type power module includes many fabrication process steps due to the need to seal a power semiconductor element with gel, resulting in the problem of an increase in component costs.

Because of this, there has been developed a transfer mold type power module in which a power semiconductor element is molded by the transfer molding method.

The transfer mold type power module is combined with a shielding plate, a control substrate, and a cooling fin, to complete a semiconductor device.

Prior art pertinent to the present invention is disclosed in Japanese Patent Application Laid-Open No. 2001-250890.

The use of the transfer mold type power module when fabricating a semiconductor device, however, requires a cooling fin or a temporary fastening member in order to fasten the transfer mold type power module, shielding plate, control substrate, and the like. And a semiconductor device is usually fabricated on the user side that prepares a cooling fin in most cases.

Therefore, when fabricating a semiconductor device, the use of the transfer mold type power module presents such problem as an increase in the number of fabrication process steps on the user side, when compared to the use of the package type power module on which only a cooling fin needs to be mounted.

SUMMARY OF THE INVENTION

It is an object of the present invention to provide a semiconductor device that does not involve an increase in the number of fabrication process steps on the user side even when a transfer mold type power module is used.

In an aspect of the present invention, a semiconductor device includes: a power module in which a power semiconductor element is sealed with resin by the transfer molding method; a control substrate for controlling the power module; and a shielding plate provided on a front main surface of the power module.

The power module includes a structure for mounting the control substrate, the control substrate being mounted over the shielding plate via the structure.

The control substrate and the shielding plate can be mounted on the power module without having to use a cooling fin or a temporary fastening member. Because the power module can be provided to users with the control substrate and the shielding plate being mounted thereon, a step of mounting a cooling fin is all that is needed by the users to complete a semiconductor device. Therefore, the problem of an increase in the number of fabrication process steps on the user side is solved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows the structure of a semiconductor device according to a first preferred embodiment of the present invention;

DESCRIPTION OF THE PREFERRED EMBODIMENTS

<First Preferred Embodiment>

Figure 2:
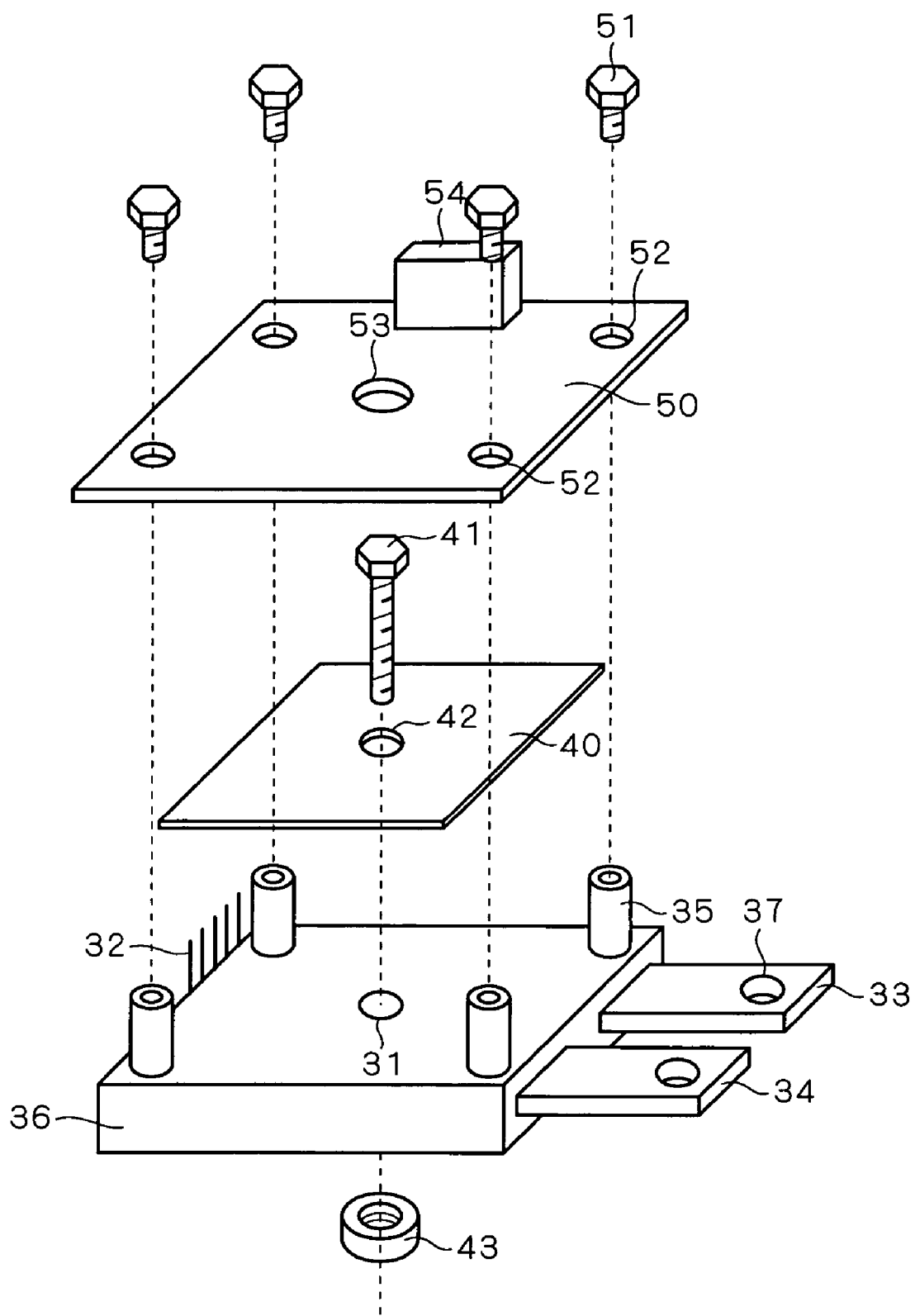
FIG. 2 shows an exploded view of the semiconductor device according to the first preferred embodiment.
Figure 3:
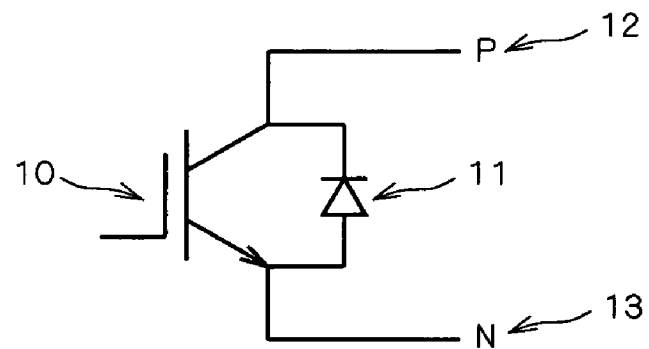
FIG. 3 shows a circuit diagram of the semiconductor device according to the first preferred embodiment.

FIG. 1 shows the structure of a semiconductor device according to a first preferred embodiment of the present invention. FIG. 2 shows an exploded view of the semiconductor device according to this embodiment, and FIG. 3 shows a circuit diagram of the semiconductor device according to this embodiment. As shown in FIG. 3, the semiconductor device according to this embodiment includes a free-wheeling diode 11 connected in anti-parallel between the collector and emitter of an IGBT (Insulated Gate Bipolar Transistor) 10, a P-pole electrode 12 connected to the collector electrode, and an N-pole electrode 13 connected to the emitter electrode.

A transfer mold type power module (henceforth sometimes referred to as the "TPM") 36 has a structure in which a power semiconductor element such as an IGBT is sealed with resin by the transfer molding method.

The structure of the semiconductor device according to this embodiment will be described with reference to FIGS. 1 and 2. Electrodes 33 and 34 that are connected to the collector electrode and emitter electrode of the power semiconductor element inside the molding resin are drawn out from a side surface of the TPM 36. Each of the electrodes 33 and 34 is provided with a screw hole 37 for connection to a bus bar electrode (not shown). The electrodes 33 and 34 correspond to the P-pole electrode 12 and the N-pole electrode 13 shown in FIG. 3, respectively. In addition, in order to control the power semiconductor element, control pins 32 for inputting a gate signal and the like to the power semiconductor element are drawn out from a side surface opposed to the electrodes 33 and 34.

The TPM 36 is provided with a projection 35 at each of the four corners on its front main surface for fastening a control substrate 50. Each of the projections 35 is provided with a screw hole (not shown) at its top end. The TPM 36 is also provided with a screw hole 31 at its center for mounting a shielding plate 40. The shielding plate 40 prevents radiation noise due to switching of semiconductor elements from affecting the control substrate 50, and further enhances the shielding effect by being connected to the ground line of the control substrate 50 via electric wires and the like. The shielding plate 40 also functions as a pressure plate for bringing the whole rear surface of the TPM 36 into complete contact with a cooling fin.

The projections 35 are formed of the molding resin at the same time the power semiconductor element is molded. Alternatively, the projections 35 may be formed separately and then screwed or joined onto the front main surface of the TPM 36 after the power semiconductor element is molded.

The shielding plate 40 is provided with a screw hole 42 in a position that corresponds to the screw hole 31 of the TPM 36, and is mounted on the upper surface of the TPM 36 by a screw 41. That is, the shielding plate 40 and the TPM 36 have holes communicating therethrough. And the shielding plate 40 is joined on the TPM 36 by the screw 41 fit in those holes.

The screw 41 cuts through the screw holes 31 and 42, to be fastened temporarily by a temporary fastening member 43 at the rear surface of the TPM 36. The temporary fastening member 43 is formed of a nut made of resin or a vinyl tube and the like. The shielding plate 40 presses the TPM 36 against a cooling fin (not shown) to establish complete contact between them when the cooling fin is mounted on the rear main surface of the TPM 36 as will be described later.

The control substrate 50 is provided with an I/F connector 54 on its front main surface, and a through hole 53 in a position that corresponds to the screw hole 31 of the TPM 36. With this structure, when mounting the cooling fin as will be described later, the screw 41 can be tightened via the through hole 53 by a screw-tightening tool without removing the control substrate 50. The control substrate 50 is also provided with a plurality of holes (not shown) for connection to the control pins 32.

In addition, the control substrate 50 is provided with screw holes 52 in positions that correspond to the projections 35 at its four corners, so that the control substrate 50 can be fastened on the TPM 36 by screws 51.

Subsequently, the fabrication method of the semiconductor device according to this embodiment will be described. First, the shielding plate 40 is fastened on the TPM 36 by the screw 41. The screw 41 cuts through the screw hole 42 provided in the shielding plate 40 and the screw hole 31 provided in the TPM 36, to be fastened temporarily by the temporary fastening member 43 at the rear surface of the TPM 36.

Next, the control substrate 50 is fastened on the TPM 36. The control substrate 50 is fastened by the screws 51 via the screw holes 52 provided at its four corners, and the screw holes provided in the projections 35.

The ends of the control pins 32 cut through the holes provided in the control substrate 50 and project onto the upper surface of the control substrate 50, to be soldered to the control substrate 50.

The transfer mold type power module used in the semiconductor device according to this embodiment includes the projections 35 at its four corners, and further includes the screw hole 31 for fastening the shielding plate 40. Thus, a structure is obtained which is capable of mounting the control substrate 50 and the shielding plate 40 on the transfer mold type power module.

That is, the TPM 36 according to this embodiment has a structure (projections 35) capable of mounting the control substrate 50 thereon, and the control substrate 50 is mounted over the shielding plate 40 via this structure.

Because the power module can be provided to users with the control substrate 50 and the shielding plate 40 being mounted thereon, a step of mounting a cooling fin is all that is needed by the users to complete a semiconductor device. Therefore, the problem of an increase in the number of fabrication process steps on the user side is solved through the use of the TPM 36.

Further, a function test on the semiconductor device with the shielding plate 40 and the control substrate 50 being mounted thereon can be conducted without mounting a cooling fin on the manufacturer side, thus reducing the burdens on the user side.

Furthermore, the provision of the temporary fastening member 43 for fastening the shielding plate 40 prevents the possibility of breakage of the control substrate 50 and the TPM 36, which can be caused by the shielding plate 40 moving freely in the space sandwiched between the control substrate 50 and TPM 36 until after the semiconductor device is fastened on the cooling fin.

Although being mounted by the projections 35 in this embodiment, the control substrate 50 may be mounted by whatever is capable of doing so. For example, the number of the projections 35 may be increased, or the projection 35 may be formed in rectangular ring shape on the upper surface of the TPM 36. With such formation, the joint between the projections 35 and the TPM 36 can be increased in strength.

<Second Preferred Embodiment>

Figure 4:
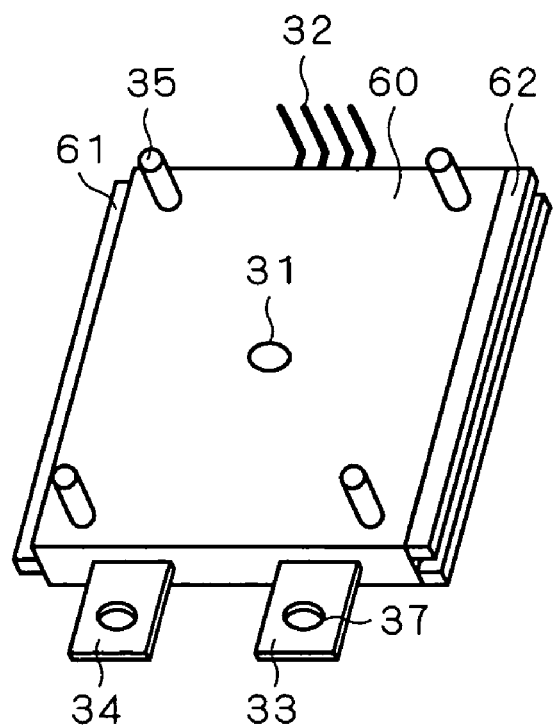
FIG. 4 shows the structure of a transfer mold type power module according to a second preferred embodiment of the present invention.

FIG. 4 shows the structure of a transfer mold type power module 60 forming a semiconductor device according to a second preferred embodiment of the present invention. The TPM 60 is provided with a first engagement part 61 and a second engagement part 62 respectively on its opposed side surfaces on which the electrodes 33 and 34 are not formed.

With this structure, a plurality of TPMs 60 can be engaged by engaging the first engagement part 61 of one TPM 60 and the second engagement part 62 of another TPM 60 with each other. That is, the TPM 60 includes the engagement parts (first engagement part 61 and second engagement part 62) on its side surfaces, so that the side surfaces of a plurality of TPMs 60 can be engaged via the engagement parts.

The remaining elements are the same as those in the first preferred embodiment, the elements being denoted by the same reference numerals to omit a redundant description.

Figure 5:
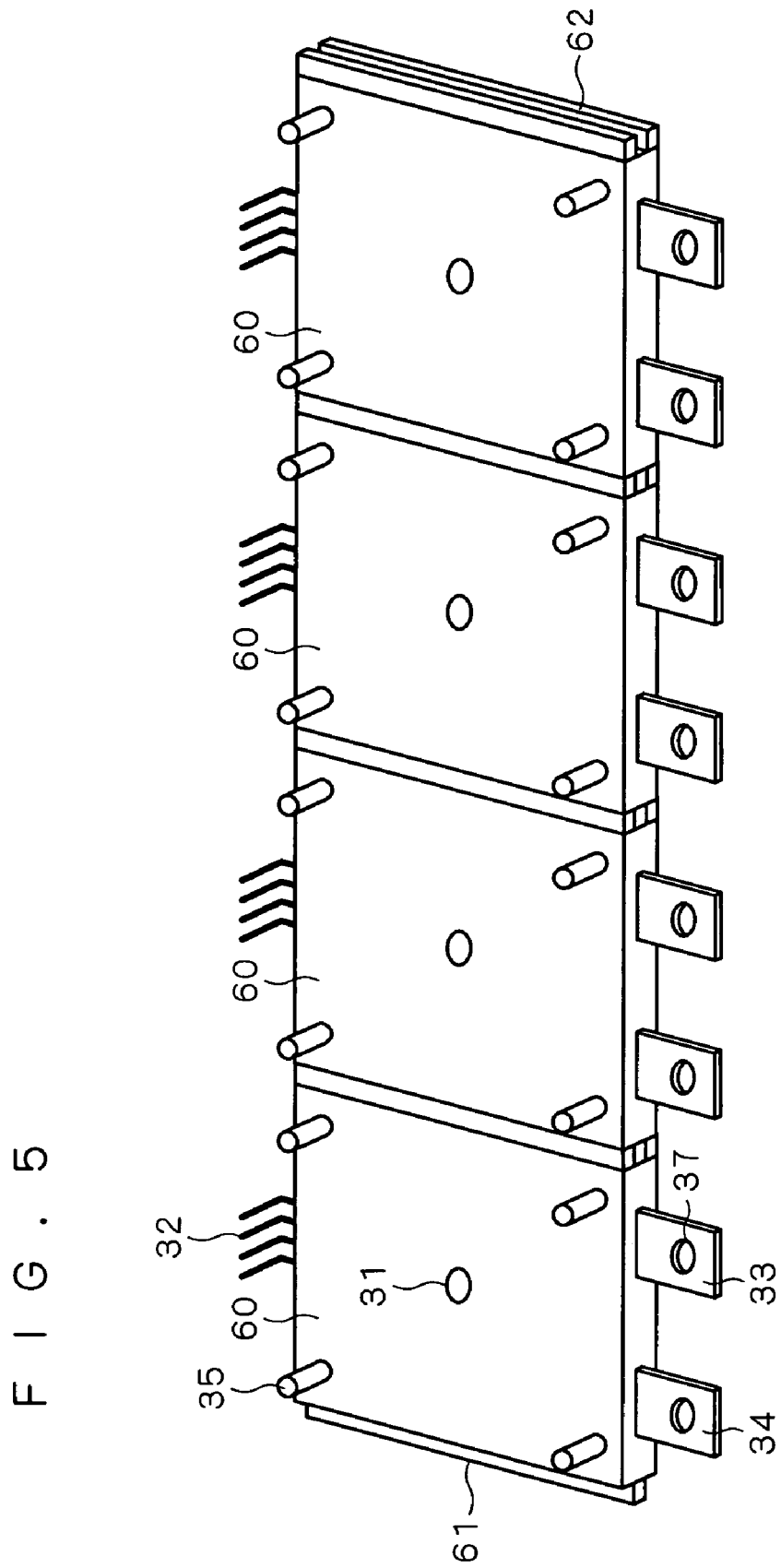
FIG. 5 shows four transfer mold type power modules according to the second preferred embodiment as joined.
Figure 6:
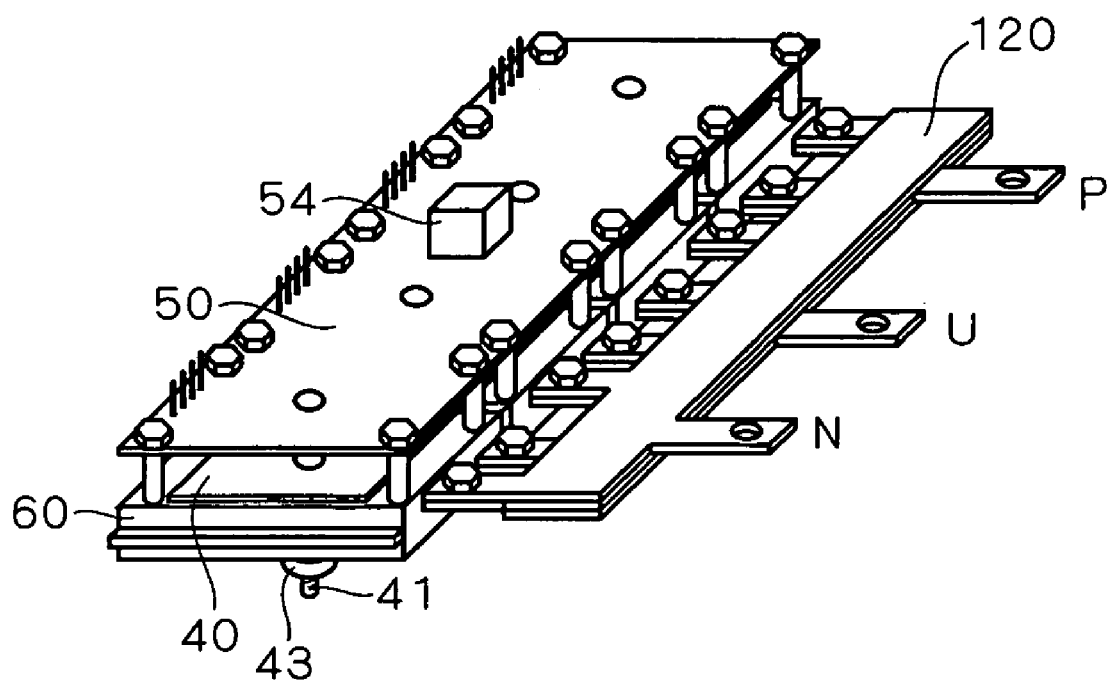
FIG. 6 shows a final drawing of a semiconductor device according to the second preferred embodiment.
Figure 7:
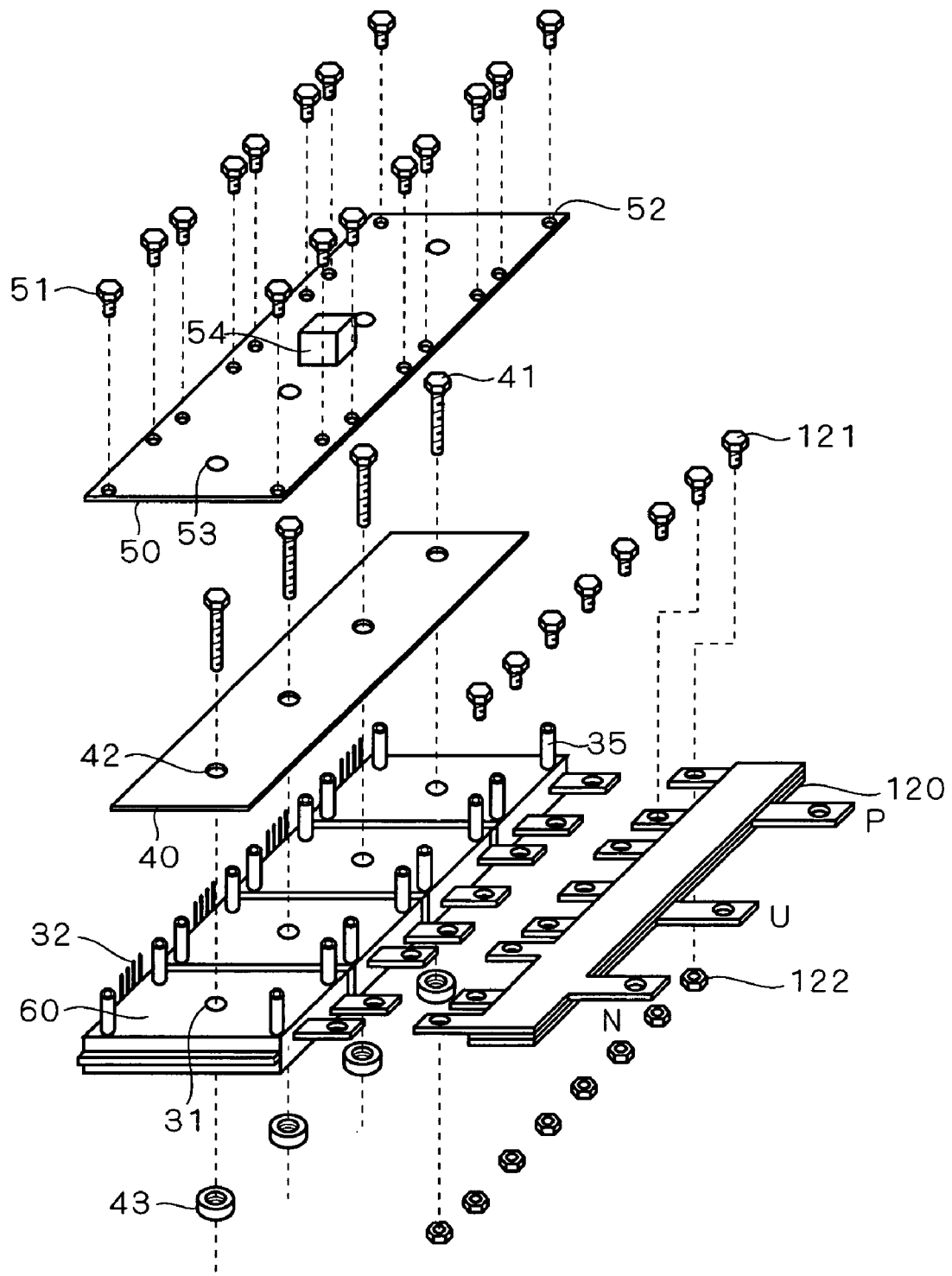
FIG. 7 shows an exploded view of the semiconductor device according to the second preferred embodiment.

FIG. 5 shows a structure in which a plurality of (four in this example) TPMs 60 according to this embodiment are continuously engaged by the engagement parts. FIG. 6 shows a semiconductor device in which the four TPMs 60 are engaged, and then the shielding plate 40, the control substrate 50 and a bus bar electrode 120 are mounted thereon. FIG. 7 shows an exploded view of the FIG. 6 semiconductor device.

The shielding plate 40 is provided with four screw holes 42 respectively corresponding to the screw hole 31 provided in each of the TPMs 60, and is joined on the TPMs 60 by screws 41. The screws 41 cut through the screw holes 31 and 42, to be fastened temporarily by temporary fastening members 43 at rear surfaces of the TPMs 60.

The control substrate 50 is provided with the I/F connector 54 on its front main surface, and the plurality of screw holes 52 in positions that correspond to the projections 35 provided on the TPMs 60. And the control substrate 50 is joined at the projections 35 of the TPMs 60 by the screws 51.

The control substrate 50 is also provided with four through holes 53 respectively corresponding to the screw holes 31 of the TPMs 60, and holes (not shown) in positions that correspond to the control pins 32 provided on the TPMs 60. With this structure, the control pins 32 project onto the control substrate 50 when the control substrate 50 is mounted.

In addition, the bus bar electrode 120 is connected to the TPMs 60. The bus bar electrode 120 includes a plurality of module side electrode terminals for connection to the electrodes 33 and 34 on the TPMs 60 side, and external electrode terminals for connection to peripheral components.

The bus bar electrode 120 is connected by screws 121 and fastening members 122 via screw holes provided in the module side electrode terminals and the screw holes 37 provided in the electrodes 33 and 34 on the TPMs 60 side.

Figure 8:
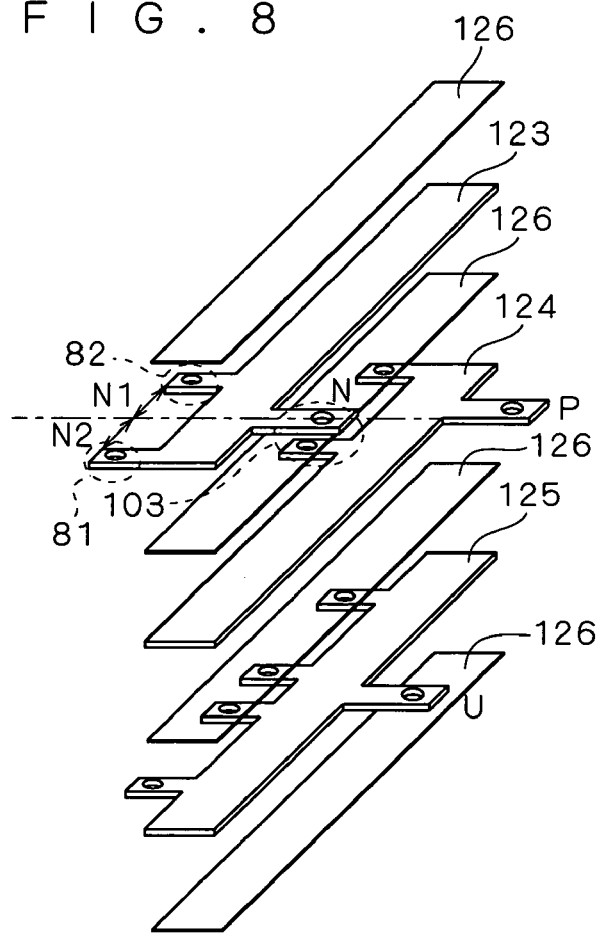
FIG. 8 shows an exploded view of a bus bar electrode used in the semiconductor device according to the second preferred embodiment.

Subsequently, the structure of the bus bar electrode 120 will be described with reference to FIG. 8. As shown, the bus bar electrode 120 consists of a plurality of partial bus bar electrodes including an N-pole connection bus bar electrode 123, a P-pole connection bus bar electrode 124, and a U-pole connection bus bar electrode 125, and insulating sheets (insulating films) 126.

The P-pole connection bus bar electrode 124 is joined on the U-pole connection bus bar electrode 125 via the insulating sheet 126. The N-pole connection bus bar electrode 123 is joined on the P-pole connection bus bar electrode 124 via the insulating sheet 126. The insulating sheets 126 are also joined on an upper surface of the N-pole connection bus bar electrode 123 and a rear surface of the U-pole connection bus bar electrode 125.

The N-pole connection bus bar electrode 123 includes module side electrode terminals 81 and 82 to be connected to the N-pole electrodes of two TPMs 60, and an N-pole external electrode terminal 103. The N-pole external electrode terminal 103 is located such that distances N1 and N2 between the module side electrode terminals 81, 82 and a line running through the center of the N-pole external electrode terminal 103 become equal to each other. Stated another way, the module side electrode terminals 81 and 82 are located in symmetry with respect to the line running through the center of the N-pole external electrode terminal 103.

Likewise, each of the P-pole connection bus bar electrode 124 and the U-pole connection bus bar electrode 125 has module side electrode terminals located in symmetry with respect to an external electrode terminal.

The fabrication method of the semiconductor device having such structure as described above will be described. First, four TPMs 60 are joined by engaging their first engagement parts 61 and second engagement parts 62 with each other. The shielding plate 40 is then joined on upper surfaces of the TPMs 60 by putting the screws 41 through the screw holes 42 and 31 and temporarily fastening the screws 41 by the temporary fastening members 43 at the rear surfaces of the TPMs 60.

Next, the control substrate 50 is mounted on the projections 35 of the TPMs 60 by the screws 51, and then the bus bar electrode 120 is mounted.

Figure 9:
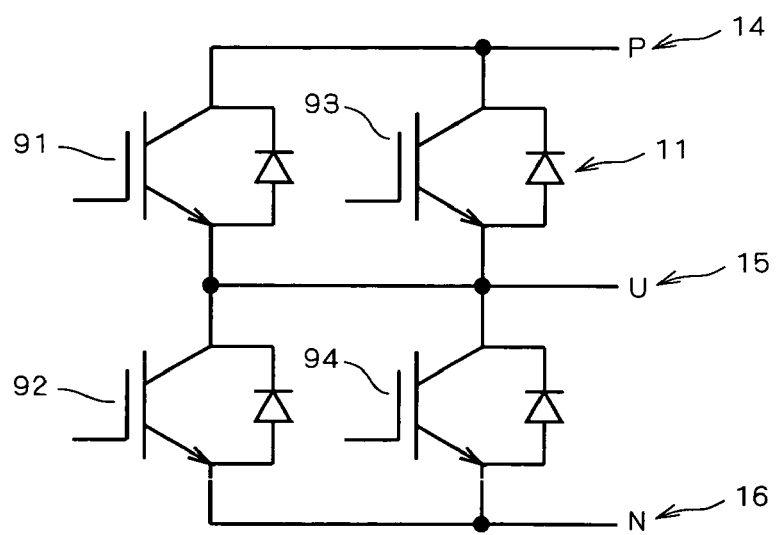
FIG. 9 shows a circuit diagram of the semiconductor device according to the second preferred embodiment.

Subsequently, the effects of using the TPM 60 according to this embodiment will be described. FIG. 9 shows a circuit diagram of two 2 in 1 type power modules connected in parallel. The collector terminal of an IGBT 91 is connected to P-pole electrode, and the emitter terminal thereof is connected to the collector terminal of an IGBT 92 and U-pole electrode. The emitter terminal of the IGBT 92 is connected to N-pole electrode.

The collector terminal of an IGBT 93 is connected to P-pole electrode, and the emitter terminal thereof is connected to the collector terminal of an IGBT 94 and U-pole electrode. The emitter terminal of the IGBT 94 is connected to N-pole electrode.

The IGBTs 91 and 92 form one 2 in 1 type power module, and the IGBTs 93 and 94 form the other 2 in 1 type power module. In addition, a freewheeling diode 11 is connected in anti-parallel between the emitter terminal and collector terminal of each of the IGBTs 91 to 94.

Figure 10:
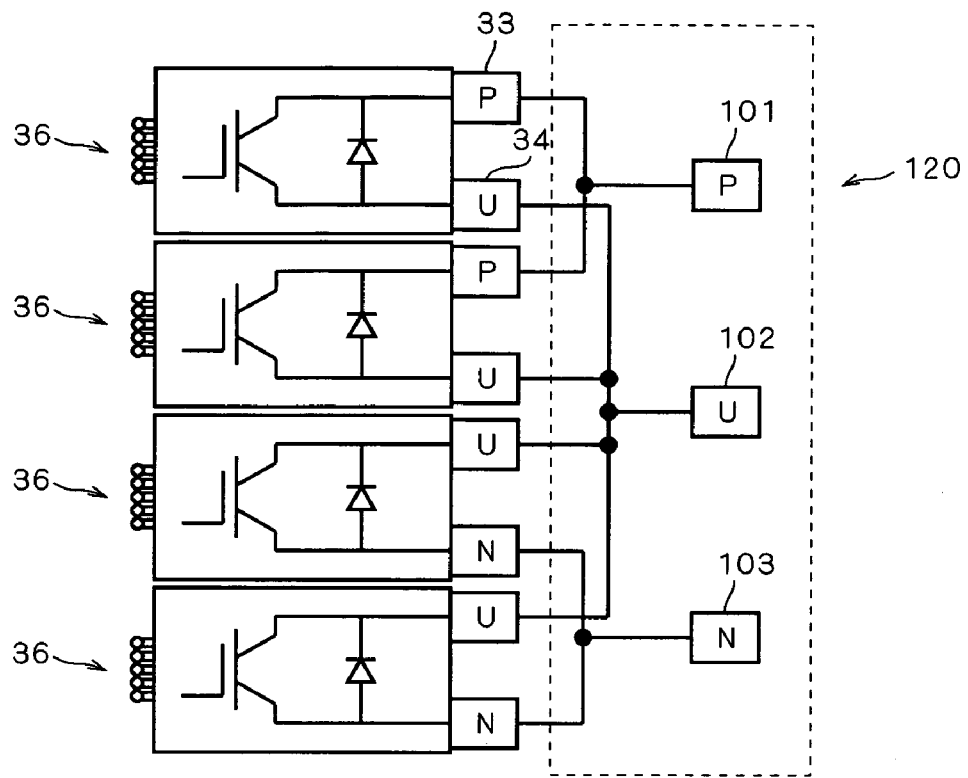
FIG. 10 shows a connection diagram by transfer mold type power modules and a bus bar electrode that corresponds to the circuit diagram of the semiconductor device according to the second preferred embodiment.

When forming a semiconductor device that corresponds to the FIG. 9 circuit diagram by the TPM 36 according to the first preferred embodiment, it is required that the TPMs 36 be disposed as shown in FIG. 10. FIG. 10 shows the semiconductor device formed by four TPMs 36, which corresponds to the FIG. 9 circuit diagram.

First to fourth TPMs 36 are disposed adjacently. The TPMs 36 each include the two electrodes 33 and 34, each of which corresponds to P-pole electrode, or N-pole electrode, or U-pole electrode.

The electrodes 33 and 34 of the first TPM 36 correspond to P-pole electrode and U-pole electrode respectively, and the second TPM 36 is disposed adjacently to the first TPM 36. The electrodes 33 and 34 of the second TPM 36 also correspond to P-pole electrode and U-pole electrode respectively.

The electrodes 33 and 34 of the third TPM 36 which is disposed adjacently to the second TPM 36 correspond to U-pole electrode and N-pole electrode respectively. The electrodes 33 and 34 of the fourth TPM 36 which is disposed adjacently to the third TPM 36 also correspond to U-pole electrode and N-pole electrode respectively.

The P-pole electrodes of the first and second TPMs 36 are connected to each other, to be connected to a P-pole external electrode terminal 101. The U-pole electrodes of the first to fourth TPMs 36 are connected to each other, to be connected to a U-pole external electrode terminal 102. The N-pole electrodes of the third and fourth TPMs 36 are connected to each other, to be connected to an N-pole external electrode terminal 103.

The respective electrodes drawn out from the TPMs 36 are connected by the bus bar electrode 120, on which are formed the P-pole external electrode terminal 101, the U-pole external electrode terminal 102, and the N-pole external electrode terminal 103.

Note that the P-pole external electrode terminal 101 corresponds to the P-pole electrode 14 shown in FIG. 9, and the U-pole external electrode terminal 102 corresponds to the U-pole electrode 15. The N-pole external electrode terminal 103 corresponds to the N-pole electrode 16.

In order to obtain the semiconductor device that corresponds to the FIG. 9 circuit by using the TPM 36, it is required that the TPMs 36 be disposed as shown in FIG. 10, which will make it difficult for the respective TPMs 36 to be fabricated without being fastened on a cooling fin.

In this embodiment, the respective TPMs 60 include the first and second engagement parts 61 and 62, as shown in FIG. 5, so four TPMs 60 can be engaged to be lumped together. It is easy to mount the control substrate 50 and the shielding plate 40 on the four TPMs 60 being engaged and lumped together without fastening the TPMs 60 on a cooling fin and the like, which will make it easy for the semiconductor device to be fabricated.

In addition, in the semiconductor device according to this embodiment in which the respective TPMs 60 are joined by the first and second engagement parts 61 and 62, the joints between the TPMs 60 can be increased in strength.

Further, the bus bar electrode 120 used in this embodiment is provided with the module side electrode terminals in symmetry with respect to the external electrode terminal. Thus, the wiring lengths from the external electrode terminal to the module side electrode terminals become equal to each other. This prevents thermal stress that is produced in semiconductor elements when current flowing into or out of each TPM 60 loses its balance.

Furthermore, the N-pole connection bus bar electrode 123 and the P-pole connection bus bar electrode 124, for example, are superimposed with the insulating sheet 126 interposed therebetween. A parasitic capacitor is formed in the superimposed portion of the electrodes 123 and 124. The N-pole connection bus bar electrode 123 and the P-pole connection bus bar electrode 124, which become connected via the parasitic capacitor, reduce parasitic inductance equivalently thus suppressing the occurrence of a switching surge.

Although a 2 in 1 type parallel-connected circuit is formed by using four TPMs 60 in this embodiment, 6 in 1 type, 12 in 1 type and the like circuits can also be formed by using more TPMs 60.

<Third Preferred Embodiment>

Figure 11:
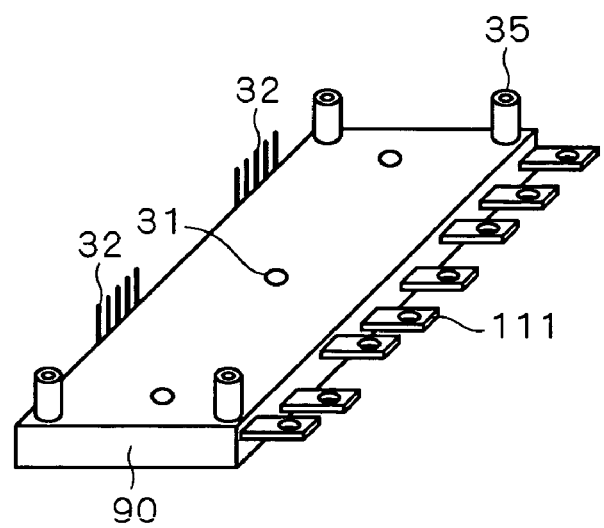
FIG. 11 shows a transfer mold type power module according to a third preferred embodiment of the present invention.

FIG. 11 shows the structure of a transfer mold type power module 90 forming a semiconductor device according to a third preferred embodiment of the present invention. As shown, in this embodiment, all semiconductor elements that correspond to the 2 in 1 type circuit structure shown in FIG. 9, for example, are sealed with resin by the transfer molding method.

The TPM 90 is provided with the projection 35 at each of the four corners on its front main surface, and screws holes 31 for connection to a shielding plate (not shown). The screw holes 31 are disposed in three places at regular internals in the longitudinal direction as viewed from top view.

A plurality of electrodes 111 are drawn out from a side surface of the TPM 90 along the longitudinal direction. The control pins 32 are drawn out from a side surface of the TPM 90 opposed to the electrodes 111.

The TPM 90 according to this embodiment, which does not need the first and second engagement parts formed thereon, requires a smaller footprint than the TPM 60 according to the second preferred embodiment does. In addition, the number of components such as the projections 35 and the like can be reduced.

<Fourth Preferred Embodiment>

Figure 12:
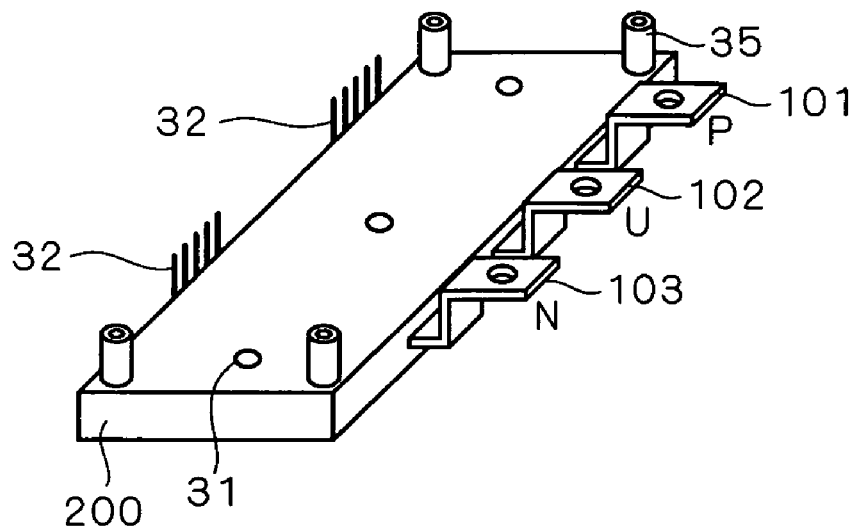
FIG. 12 shows a transfer mold type power module according to a fourth preferred embodiment of the present invention.

FIG. 12 shows the structure of a transfer mold type power module 200 forming a semiconductor device according to a fourth preferred embodiment of the present invention. The TPM 200 is a power module in which the bus bar electrode 120 is joined to a power semiconductor element (not shown) inside the TPM 200 by wire bonding, and then the bus bar electrode 120 and the power semiconductor element inside the TPM 200 are sealed together with resin by the transfer molding method.

Figure 13:
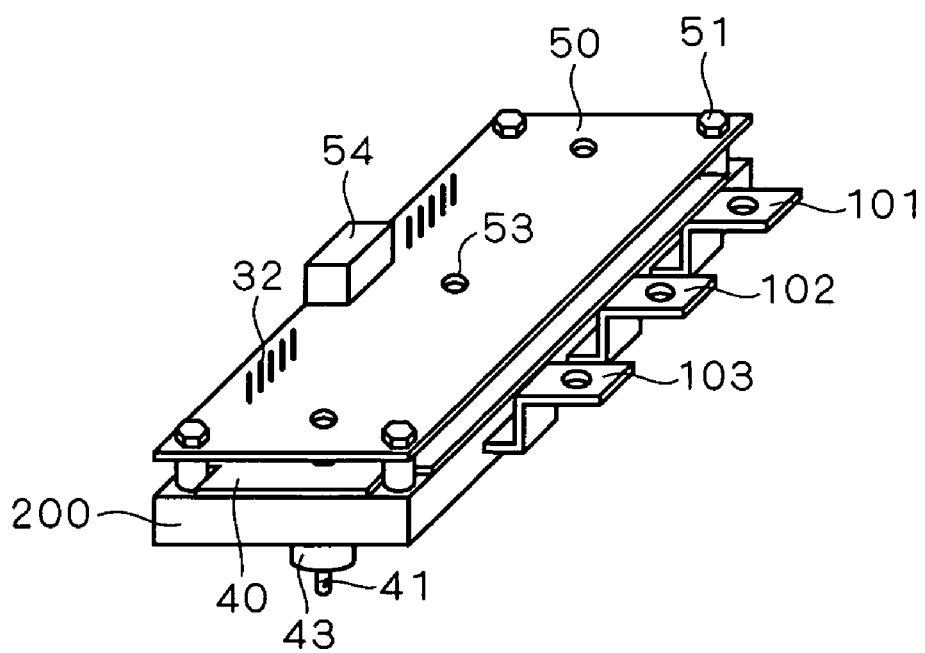
FIG. 13 shows a final drawing of a semiconductor device according to the fourth preferred embodiment.

FIG. 13 shows a final drawing of the semiconductor device using the TPM 200 according to this embodiment. The shielding plate 40 is mounted on the TPM 200. The shielding plate 40 is fastened on the TPM 200 by the screws 41 and the temporary fastening members 43.

Figure 14:
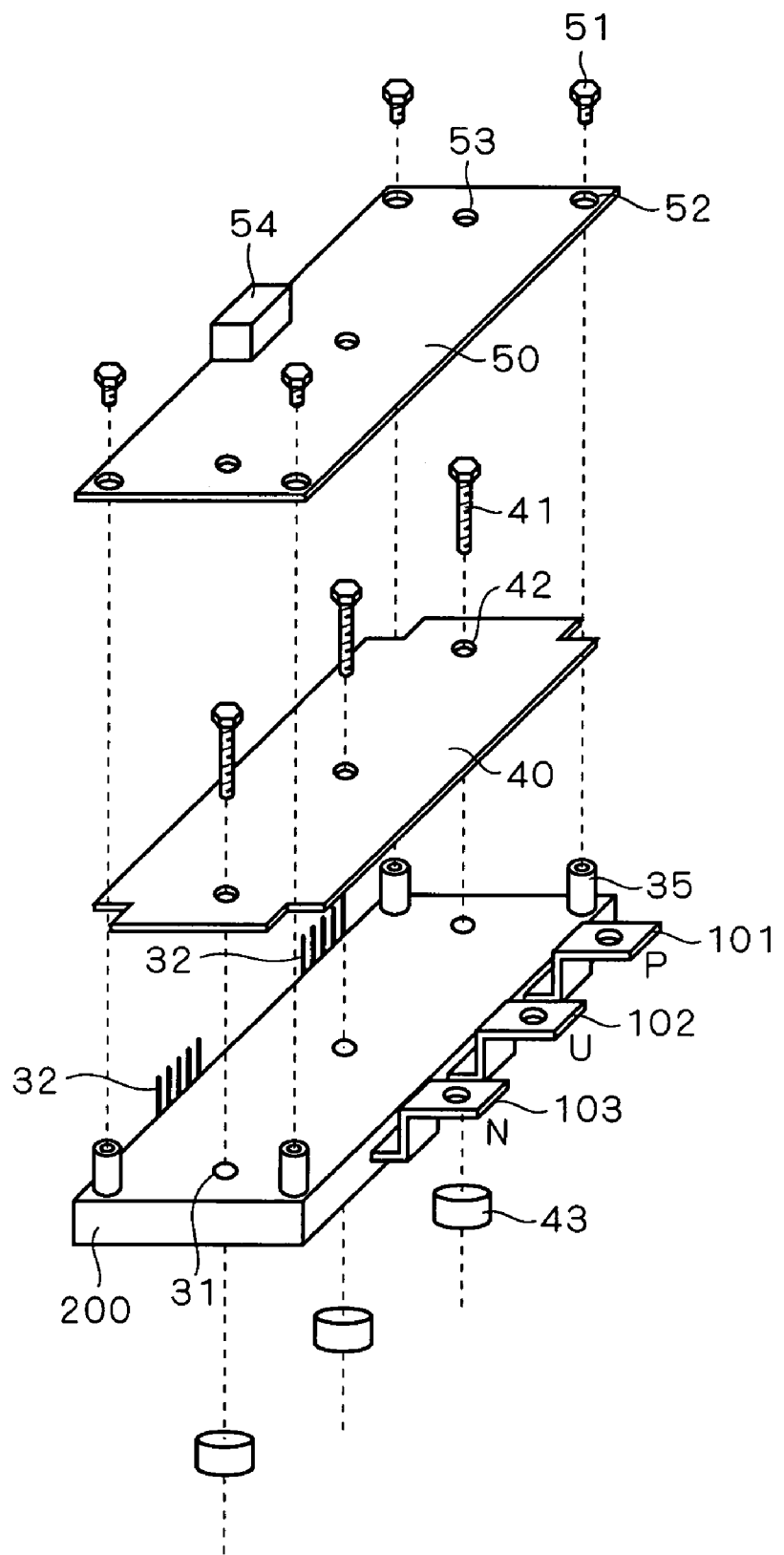
FIG. 14 shows an exploded view of the semiconductor device according to the fourth preferred embodiment.

FIG. 14 shows an exploded view of the semiconductor device using the TPM 200 according to this embodiment.

Subsequently, a method of manufacturing the semiconductor device according to this embodiment will be described. First, the shielding plate 40 is mounted on a front main surface of the TPM 200. The shielding plate 40 is joined on the TPM 200 by the screws 41 via the screw holes 42 provided in the shielding plate 40 and the screw holes 31 provided in the TPM 200. Next, the control substrate 50 is mounted on the projections 35 of the TPM 200 by the screws 51, to complete the semiconductor device shown in FIG. 13.

Figure 15:
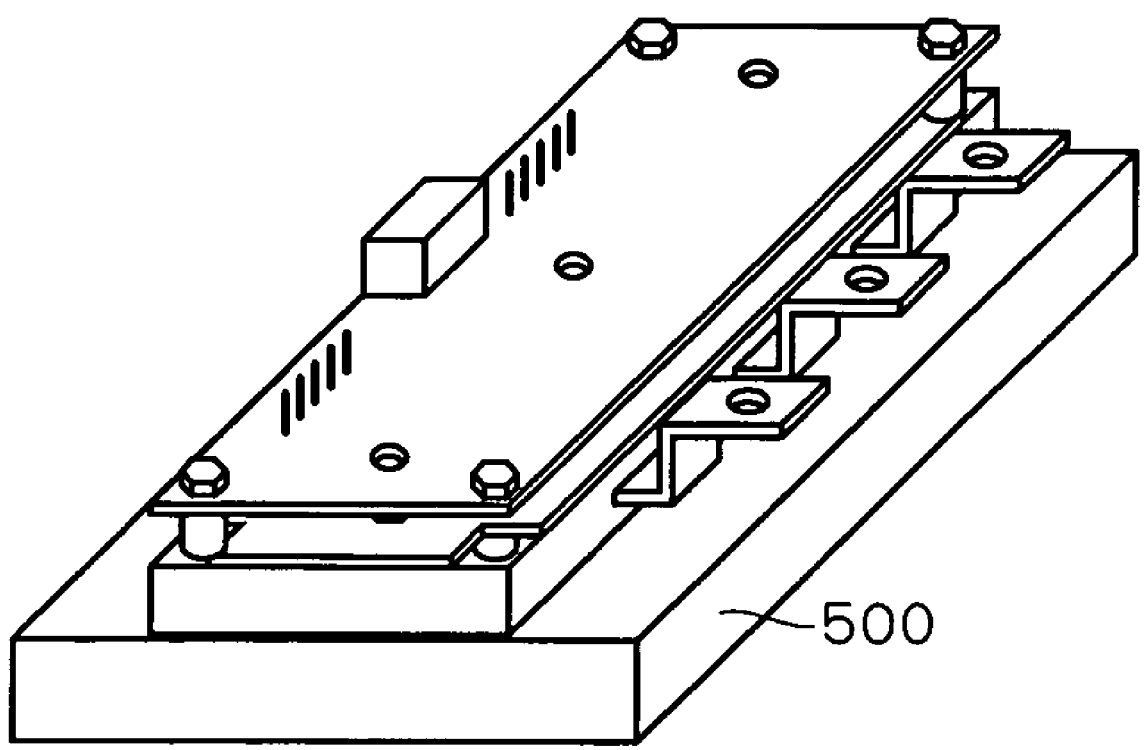
FIG. 15 shows the semiconductor device according to the fourth preferred embodiment with a cooling fin mounted thereon.

With the control substrate 50 being mounted, a function test on the power module can be conducted at this stage. After conducting the function test, a cooling fin 500 is mounted as shown in FIG. 15. The cooling fin 500 is provided with screw holes (not shown) in positions that correspond to the screw holes 31 provided in the TPM 200.

When mounting the TPM 200 on the cooling fin 500, the temporary fastening members 43 are removed, and then the TPM 200 is placed such that the screws 41 are put through the screw holes of the cooling fin 500. The TPM 200 is then mounted on the cooling fin 500 by tightening the screws 41 by an appropriate tool via the through holes 53 provided in the control substrate 50. At this time, being pressed by the shielding plate 40, the TPM 200 is brought into complete contact with the cooling fin 500.

With such structure as described above, the semiconductor device according to this embodiment eliminates the addition of the module side electrode terminals by molding the bus bar electrode 120 and the power semiconductor element inside the TPM 200 together, allowing a reduction in the number of components. Moreover, because the joints between the TPM side electrodes and the module side electrode terminals of the bus bar electrode 120 are no longer needed, the wiring length of the bus bar electrode 120 is reduced correspondingly, allowing a reduction in parasitic inductance.

<Fifth Preferred Embodiment>

Power semiconductor devices usually have peripheral components connected, such as smoothing capacitor, discharge resistor, snubber capacitor between electrodes, reactor and the like. In a fifth preferred embodiment of the present invention, those peripheral components are also sealed with resin by the transfer molding method.

The resin sealing including the peripheral components allows a reduction in the number of components to be fabricated, a reduction in the number of process steps, and also miniaturization of the semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a power module in which a power semiconductor element is sealed with resin, said power module having a first hole extending therethrough and a substantially planar top surface;
   a control substrate for controlling said power module and having a second hole extending therethrough and aligned with said first hole of said power module; and
   a shielding plate having a third hole extending therethrough and aligned with said first hole of said power module and said second hole of said control substrate, and having a substantially planar bottom surface mounted directly and entirely on said top surface of said power module via a fastener disposed through said first and third holes,
   wherein said power module includes a structure for mounting said control substrate to said power module, said control substrate being mounted above said shielding plate via said structure.

2. The semiconductor device according to claim 1, wherein said shielding plate is mounted on only a part of said top surface of said power module via said fastener, said power module includes projections formed at locations on said top surface other than said part of said top surface on which said shielding plate is mounted and said control substrate is joined to said projections.

3. The semiconductor device according to claim 2, wherein said power module is substantially rectangular, and said projections are respectively formed on corners of said power module.

4. The semiconductor device according to claim 2, wherein said control substrate has a plurality of fourth holes extending therethrough, and said projections each have a fifth hole formed therein and extending through an upper portion thereof, each one of said fourth holes of said control substrate being respectively aligned with one of said fifth holes formed in said projections, and
said control substrate is fastened to said projections via another fastener disposed through each corresponding pair of one of said fourth holes of said control substrate and one of said fifth holes of said projections.

5. The semiconductor device according to claim 1, further comprising a temporary fastening member for temporarily fastening said fastener at a bottom surface of said power module to said top surface of said power module.

6. The semiconductor device according to claim 5, wherein said power module includes engagement parts on its side surfaces, so that side surfaces of a plurality of said power modules can be engaged via said engagement parts.

7. The semiconductor device according to claim 6, further comprising a plurality of said power modules, said plurality of said power modules being continuously engaged by said engagement parts.

8. The semiconductor device according to claim 7, further comprising a bus bar electrode for connection to electrode terminals of said plurality of power modules, wherein
said bus bar electrode includes external electrode terminals for connection to peripheral components and module side electrode terminals for connection to said electrode terminals, and
said module side electrode terminals are located in symmetry with respect to said external electrode terminals.

9. The semiconductor device according to claim 8, wherein
said bus bar electrode includes a plurality of partial bus bar electrodes, and
said partial bus bar electrodes are joined to insulating films interposed therebetween.

10. The semiconductor device according to claim 5, wherein said fastener is a screw, and said temporary fastening member is a nut made of resin or a vinyl tube.

11. The semiconductor device according to claim 1, wherein
said power module further includes a bus bar electrode connected to said power semiconductor element, and
said power semiconductor element and said bus bar electrode are sealed together with resin.

12. The semiconductor device according to claim 11, wherein
said power module further includes peripheral components connected to said bus bar electrode, and
said power semiconductor element, said bus bar electrode, and said peripheral components are sealed together with resin.

13. The semiconductor device according to claim 1, further comprising a cooling fin provided on a bottom surface of said power module opposite to said top surface of said power module.

14. The semiconductor device according to claim 13, wherein said control substrate mounted to said power module is configured to accommodate, while said shielding plate is mounted to said power module, a tool through said second hole to mount said cooling fin to said bottom surface of said power module via said fastener disposed through said first and third holes aligned with said second hole.

15. The semiconductor device according to claim 1, wherein the shielding plate provides a shielding effect for the control substrate.

16. The semiconductor device according to claim 15, wherein the shielding plate also functions as a pressure plate.

17. The semiconductor device according to claim 1, wherein the shielding plate prevents radiation noise from affecting the control substrate.

18. The semiconductor device according to claim 1, wherein
said first hole extends from a central portion of said top surface of said power module through a central portion of a bottom surface of said power module opposite to said top surface of said power module,
said third hole extends from a central portion of a top surface of said shielding plate through a central portion of said bottom surface of said shielding plate opposite to said top surface of said shielding plate, and
said fastener is disposed through said first and third holes respectively provided at the central portions of said power module and said shielding plate so as to mount said shielding plate on said power module by bringing said bottom surface of said shielding plate into contact with said top surface of said power module.

19. The semiconductor device according to claim 1, wherein said fastener is a screw.

20. The semiconductor device according to claim 1, wherein
the power semiconductor element is sealed with said resin by the transfer molding method, and
said shielding plate is connected to a ground line of said control substrate.

21. The semiconductor device according to claim 1, wherein said control substrate mounted to said power module is configured to provide access, while said shielding plate is mounted to said power module, to said fastener disposed through said first and third holes aligned with said second hole, via said second hole.

22. A method of manufacturing the semiconductor device recited in claim 1, comprising the steps of:
(a) mounting said shielding plate on said power module;
(b) mounting said control substrate on said power module; and
(c) conducting a function test on said power module with said shielding plate and said control substrate being mounted threreon.

23. The method of manufacturing the semiconductor device according to claim 11, further comprising the step of mounting a cooling fin on a bottom surface of said power module after said step (c).

24. A method of manufacturing the semiconductor device recited in claim 5, comprising the steps of:
removing said temporary fastening member; and
mounting a cooling fin by said fastener disposed in said first and third holes.

* * * * *